US006125036A

United States Patent [19]
Kang et al.

[11] Patent Number: 6,125,036
[45] Date of Patent: Sep. 26, 2000

[54] MOISTURE BARRIER SEALS FOR COOLED IC CHIP MODULE ASSEMBLIES

[75] Inventors: Sukhvinder Kang, Rochester, Minn.; Howard Victor Mahaney, Jr., Cedar Park, Tex.; Roger R. Schmidt; Prabjit Singh, both of Poughkeepsie, N.Y.

[73] Assignee: International Business Machines Corporation, Armonk, N.Y.

[21] Appl. No.: 09/415,755

[22] Filed: Oct. 12, 1999

[51] Int. Cl.[7] .................................................. H05K 7/20
[52] U.S. Cl. ..................... 361/700; 361/699; 361/701; 361/705; 361/708; 361/719; 257/714; 257/715; 175/15.1; 175/15.2; 165/80.4; 165/80.5
[58] Field of Search ................................ 361/689, 690, 361/698, 699, 700, 701, 704, 705, 707, 708, 719; 257/714, 715, 716; 174/15.1, 15.2, 16.1, 16.2; 165/80.3, 80.4, 80.5, 104.33

[56] References Cited

U.S. PATENT DOCUMENTS

| | | | |
|---|---|---|---|
| 4,323,914 | 4/1982 | Berndmaler et al. | 257/713 |
| 4,860,444 | 8/1989 | Herrell et al. | 29/840 |
| 4,938,280 | 7/1990 | Clark | 165/80.4 |
| 5,028,988 | 7/1991 | Porter et al. | 357/81 |
| 5,142,443 | 8/1992 | Moore, Jr. | 361/385 |
| 5,184,211 | 2/1993 | Fox | 257/706 |
| 5,268,812 | 12/1993 | Conte | 361/698 |
| 5,268,814 | 12/1993 | Yakubowski | 361/704 |
| 5,349,823 | 9/1994 | Solomon | 62/6 |
| 5,365,749 | 11/1994 | Porter | 62/259.2 |
| 5,387,815 | 2/1995 | Nishiguchi | 257/704 |
| 5,463,872 | 11/1995 | Vader et al. | 62/51.1 |
| 5,504,924 | 4/1996 | Ohashi et al. | 375/800 |
| 5,702,985 | 12/1997 | Burns | 438/119 |
| 5,780,928 | 7/1998 | Rostoker et al. | 257/713 |
| 5,918,469 | 7/1999 | Cardella | 165/80.3 |
| 5,931,222 | 8/1999 | Toy et al. | 165/80.3 |
| 5,944,093 | 8/1999 | Viswanath | 165/104.26 |
| 5,956,229 | 9/1999 | Brownell et al. | 361/699 |
| 5,990,418 | 11/1999 | Bivona et al. | 174/52.4 |

*Primary Examiner*—Leo P. Picard
*Assistant Examiner*—Boris L. Chervinsky
*Attorney, Agent, or Firm*—Floyd A. Gonzalez; Cantor Colburn LLP

[57] ABSTRACT

A cooling assembly for an integrated circuit chip module wherein an evaporator-cooled IC module is enclosed within an insulated housing which features a moisture barrier on its outer wall surface.

11 Claims, 3 Drawing Sheets

MOISTURE BARRIER SEALS FOR COOLED IC CHIP MODULE ASSEMBLIES

BACKGROUND OF THE INVENTION

The present invention relates to cooling technology for electronic packaging for computer systems, and, more particularly, relates to a moisture sealed cooling assembly for lowering the temperature of integrated circuit (IC) chip modules mounted on a printed circuit board (PCB) subsrate.

The high circuit densities and operating frequencies in modern integrated circuit devices and multi-chip modules of today's computer systems has resulted in a significant increase in the power dissipated by such chip and module components. No matter how fast one wishes to operate a given electronic circuit chip, there almost always is the potential for running it faster if the chip were to be cooled further and more thermal energy is removed during its operation. This is true of computer processor circuit chip's land more particularly of such chips disposed within multi-chip modules that generate significant amounts of heat. Because of the demand to run processor modules at increasingly higher speeds, the clock frequencies at which the devices must operate also increases. Power generation correspondingly rises in proportion to the clock frequency, generation thermal demands in terms of energy which must be removed for faster, safer, and more reliable circuit operation. It is required that cooling arrangements be provided so that the heat generated by the operation of these components be effectively and efficiently removed in order to maintain the temperature of the devices within the limits that will keep the operating parameters of the devices in a predetermined range, and, further, to prevent the damage or destruction of the integrated circuit devices by overheating from the high temperatures generated.

Using refrigeration technology, integrated circuit chips and multi-chip modules readily can be cooled to appropriately low temperatures. In addition, however, to the necessity of cooling to prevent damage from overheating, it is also recognized that the cooling offers marked advantages in circuit speed, system throughput, and component reliability. With the event of CMOS processors for computers, the potential performance improvements obtained by lowering chip temperature are intriguing. It is known that a CMOS circuit is capable of operating at higher clock speeds as the circuit temperature is lowered. Current CMOS chip circuit designs generally perform about two percent faster for each 10° C. the chip temperature is lowered. Accordingly, it would not be unreasonable to achieve a 100° C. reduction in chip temperature with refrigeration techniques as compared to cooling with ambient air, thus achieving a 20% performance improvement. It has been reported that the processor frequency of a CMOS processor has been improved by nearly threefold by cooling the precessor to temperatures around −200° C.

Various techniques for the cooling of integrated circuit electronic devices are known and may have been implemented with success. Some practice techniques involve conventional methods such as by direction ambient air onto the components to be cooled; by sealing the computer cabinet and refrigerating the interior of the cabinet; as well as by immersing components in coolants such as liquid nitrogen. Individual integrated chip or multi-chip module components also have cooled through specialized devices such as hollow cold plates which are attached to the components to be cooled. Liquid coolants can be circulated through the hollow cold plates to effect cooling of the attached components.

However, in order to take practical advantage of the performance improvements achievable by lowering integrated chip temperatures to levels, for example, in the range of −40° C. to −60° C., many engineering problems must be addressed. In addition to issues involving refrigeration system design, evaporator design, and thermal controls, cooling of the electric components to a temperature below the ambient environment dew point results in condensation problems in that moisture will condense on the cooled components and the structures and components to which the cooled components may be attached. This condensation can damage and literally destroy the electronic circuitry associated with the integrated chip or multi-chip module and the circuit board on which it is mounted.

Accordingly, a cooling system is needed for an integrated chip or multi-chip module device which effectively and efficiently can reduce the temperature of the device to below ambient dew point without causing condensation damage to the device or contiguous components or circuitry.

SUMMARY OF THE INVENTION

Now, an improved assembly for cooling all integrated circuit (IC) device mounted on a printed circuit board (PCB) within a computer system has been developed whereby cooling of the IC device is efficiently and effectively accomplished while damaging condensation is controlled front forming on the cooled devices as well as on the PCB on which the IC device is mounted. According to the present invention, a cooling assembly is provided which comprises an evaporator unit attached to the top of the hat, or cover, of an integrated chip module and in thermal communication with the hat surface. In order to maintain the reduced temperature of the cooled device and isolate the device from the ambient warm environment, the IC module and attached cooling evaporator unit are housed within an insulated enclosure which fully envelops the device and evaporator and is itself bonded around its bottom peripheral edge to the surface of the printed circuit board around the outer perimeter of the module to board interface. The enclosure includes walls fabricated from thermal insulating material. Such material comprises rigid structural foam such as polyurethane foam, expanded polystyrene, and the like, in order to provide structural integrity as well as a thermal insulative barrier. Typically, such structural foams feature thermal conductivities ranging from about 0.04 to about 0.12 W/m.° K. The preferred insulating material is rigid polyurethane foam. While it is critical to cool the IC module to low temperatures, typically in the range of about −40° C. to about −60° C., cooling to such temperatures below ambient dew point presents potential condensation problems on the cooled component. The described insulation helps to isolate the cooled module from the surrounding environment, but, at the low temperatures to which the module is cooled, any moisture leaking into the insulated enclosure will result in condensation. In order to enhance the effectiveness of the insulated enclosure, according to the present invention, the enclosure is sealed with a moisture impervious barrier. While the module enclosure preferably is constructed from a rigid insulation material, such as a polyurethane foam, this material is not totally impervious to moisture. To effect a moisture barrier, pursuant to the present invention, the outer surface of the enclosure housing is coated with a layer of a material that is impervious to moisture, such as metallic or polymeric coating. Preferred is a metallic sealant. Metals such as copper, nickel, zinc, and the like, can readily be applied by electroplating, electroless plating techniques, and the like. In addition, metals such as aluminum, copper, nickel, zinc, and the like, can be applied by techniques such as, plasma spraying, ion vapor deposition, and the like. A preferred moisture barrier is a polymeric material, including, butyl rubber, synthetic poly(isoprene), and the like. A preferred moisture barrier is butyl rubber, that most readily can be applied by molding.

An additional moisture barrier means for sealing the module housing enclosure from outside moisture is to seal the interface between the bottom periphery of the insulated housing and the printed circuit board. This interface is a primary site for potential air leaks into the module enclosure. According to the present invention, a compliant polymeric gasket is provided to mate to the bottom peripheral edge of the housing and seal to the PCB. A preferred gasket material is butyl rubber. In order to seal effectively to the surface of the printed circuit board where there may be components, such as capacitors, already attached to the PCB surface, the side of the gasket contacting the PCB preferably is provided with recesses generally corresponding in size, shape, and position with components on the PCB in area of the interface. Additionally, to better seal to the bottom of the insulated housing, the side of the gasket mating with the bottom peripheral edge of the housing includes protuberances extending around the gasket surface at selected locations to form a more positive seal contact. These protuberances may take the form of rounded or pointed bumps on the gasket surface, or may take the form of a lip around the edge of the gasket.

The above-discussed and other features and advantages of the present invention will be appreciated and understood by those skilled in the art from the following detailed description and drawings.

BRIEF DESCRIPTION OF THE DRAWINGS

Referring now to the drawings in which like elements are numbered above in the several Figures.

DETAILED DESCRIPTION OF THE INVENTION

Figure 1:
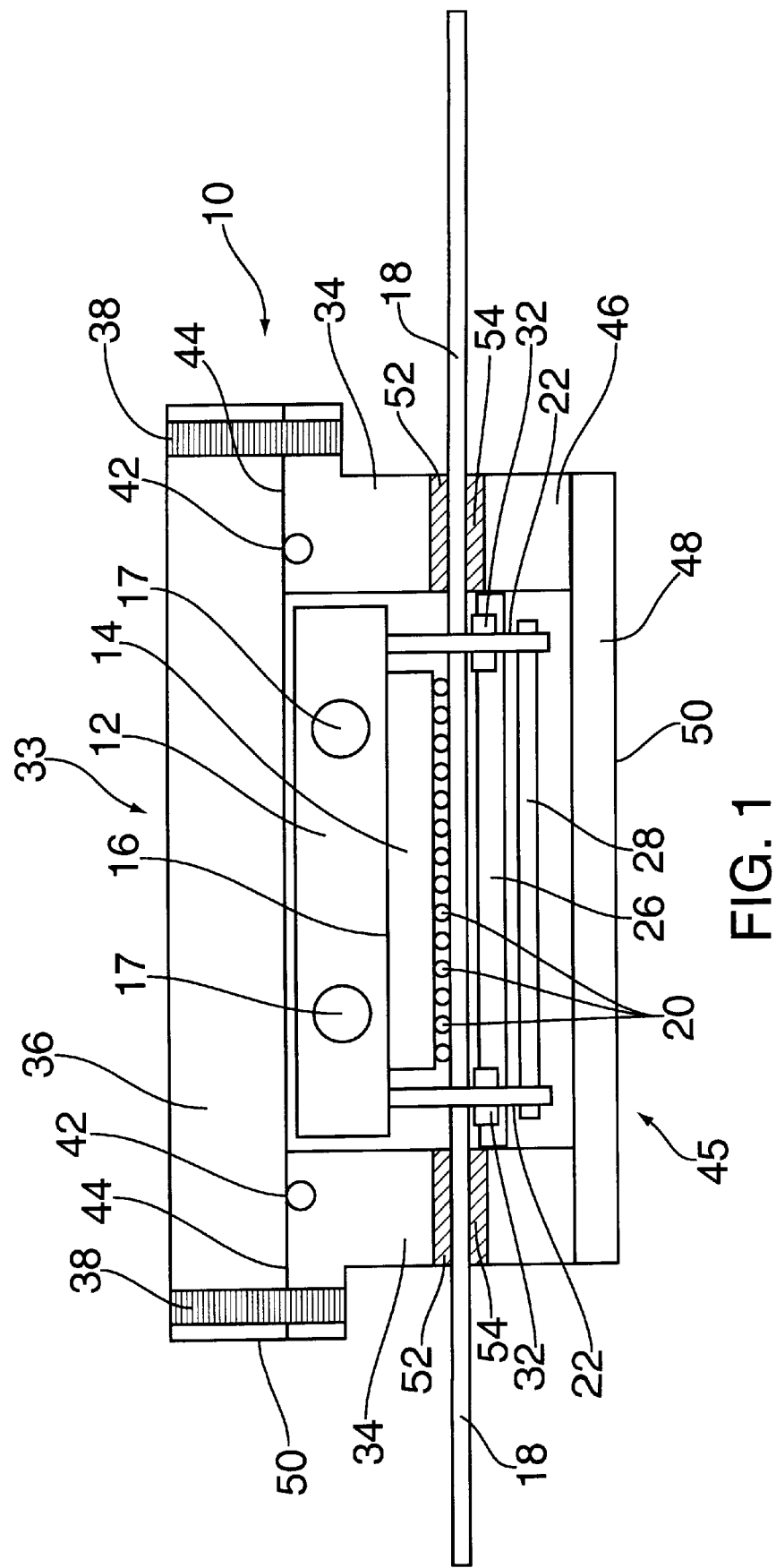
FIG. 1 is a cross-sectional side view illustrating an evaporator cooled IC module inclosed within a housing having a moisture barrier according to the present invention.

Referring to FIG. 1, a cooling assembly 10 is shown comprising an evaporator unit 12, which is a thermal block of aluminum or copper, mounted on top of the hat, or cover, of integrated circuit chip module 14, forming a thermal interface through conductive grease 16. In operation, coolant fluid from a refrigeration unit (not shown) is circulated through serpentine passages 17, bored or drilled into evaporator block 12, in a predetermined pattern. IC module 14 is in electrical communication with printed circuit 18 via solder ball interconnects 20. The evaporator unit 12 is attached to the printed circuit board 18 by bolts 22, around its periphery, which extend from evaporator 12 and pass through printed circuit board 18 and are threaded into stiffener member 26, which serves to reinforce and stiffen the printed circuit board 18 to prevent it from flexing under the stress of the mounted cooling assembly 10, and finally threaded into steel spring plate 28. Rubber O-rings 32 seal around the mounting bolts and help to prevent air leakage into the assembly. In order to insulate the IC module 14 from the warm ambient surroundings, the evaporator-cooled module 14 is fully enclosed within an insulated housing 33 comprising a base member 34 and lid 36. Base 34 is made of a rigid polyurethane foam material, which preferably is formed by being molded to the appropriate shape. The bottom of enclosure base member 34 is bonded to the surface of the printed circuit board 18 through a suitable adhesive (not shown). The lid 36, which is separated and removable from base 34 in order to provide service access to IC module 14, also is made from a rigid polyurethane foam and is attached to the base by threaded connectors 38. To ensure an airtight seal between the lid 36 and base 34, an O-ring 42 is set around the interface of the lid 36 and base 34, along with a layer of sealant grease 44. In the embodiment shown, the back side of the PCB 18 also is encased within a back side insulated housing unit 45 comprising base member 46 and lid member 48.

In order to seal the insulated enclosure front moisture on the ambient environment, a moisture barrier coating of butyl rubber 50 is applied to the entire outer surface of both insulated housing 33 and back side insulated housing 45. Additionally, butyl rubber gaskets 52 and 54 are provided to seal the interfaces between insulated housing base 34 and back side base member 46 respectively and PCB 18.

Figure 2:
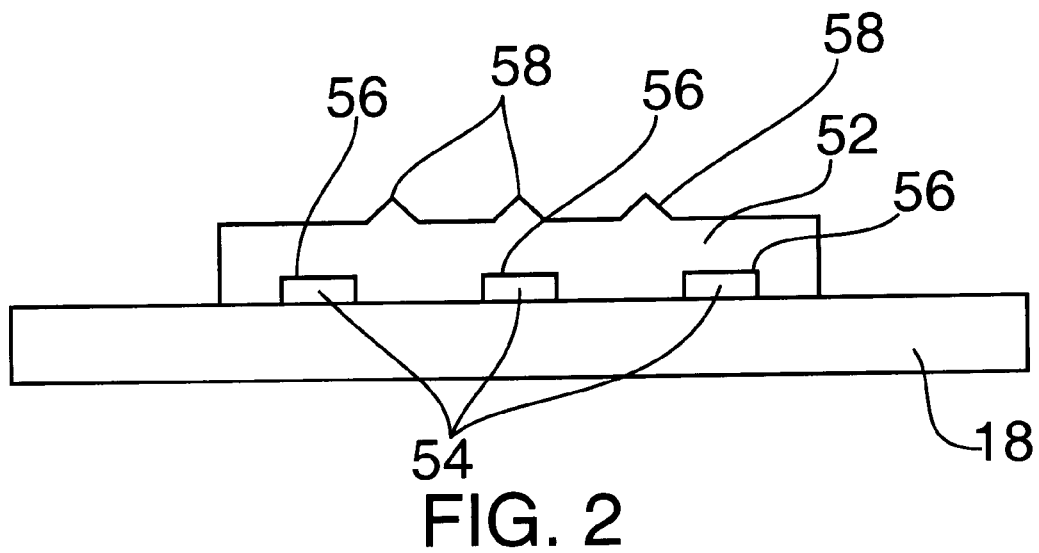
FIG. 2 is a simplified cross-sectional side view of a moisture barrier gasket pursuant to the present invention.

In FIG. 2, one embodiment is shown of a compliant polymeric gasket used for providing a moisture barrier for the interface between insulated housing base 34 and/or back side base member 46 and the top or bottom side, respectively, of PCB 18. The gasket 52 is made of butyl rubber material. The gasket 52 is shown in sealing position against printed circuit board 18. Capacitors 55 mounted on PCB 18 fit into recesses 56 provided in the bottom surface of gasket 52, corresponding in size, and position with capacitors 55. To provide a moisture tight seal with the base of the insulated housing (not shown) the top surface of gasket 52 includes protuberances 58 to be compressed when mated with the insulated housing base.

Figure 3:
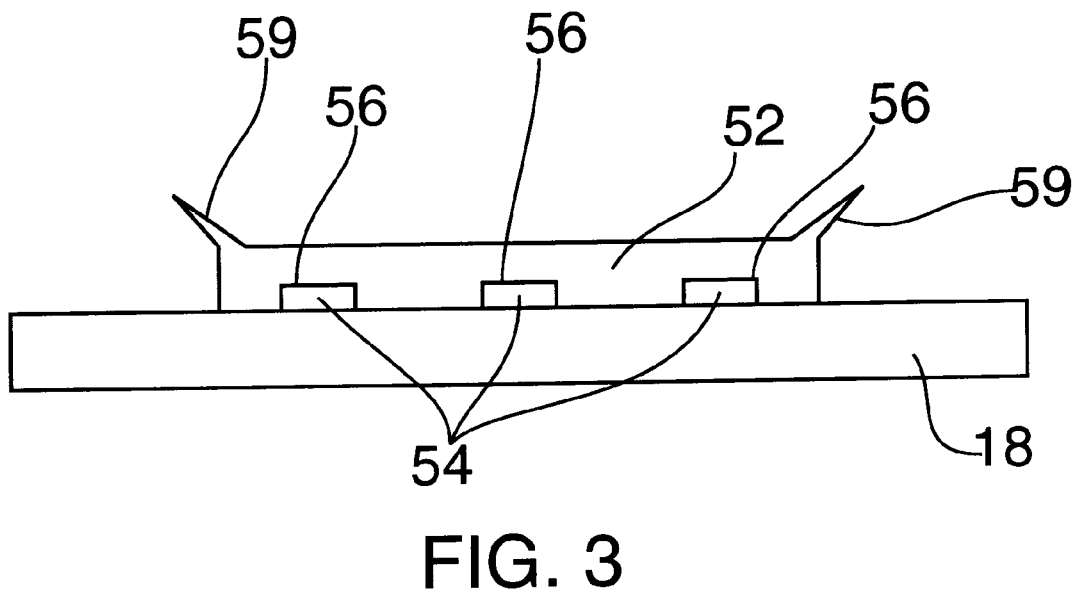
FIG. 3 is a simplified cross-sectional side view of a second embodiment of a moisture barrier gasket pursuant to the present invention.

FIG. 3 shows a second embodiment of a moisture barrier gasket in which lips 59 are provided along the peripheral edge of the gasket 52. The lips 59 are compressed and form a moisture seal when the gasket 52 is mated against the insulated housing base (not shown).

Figure 4:
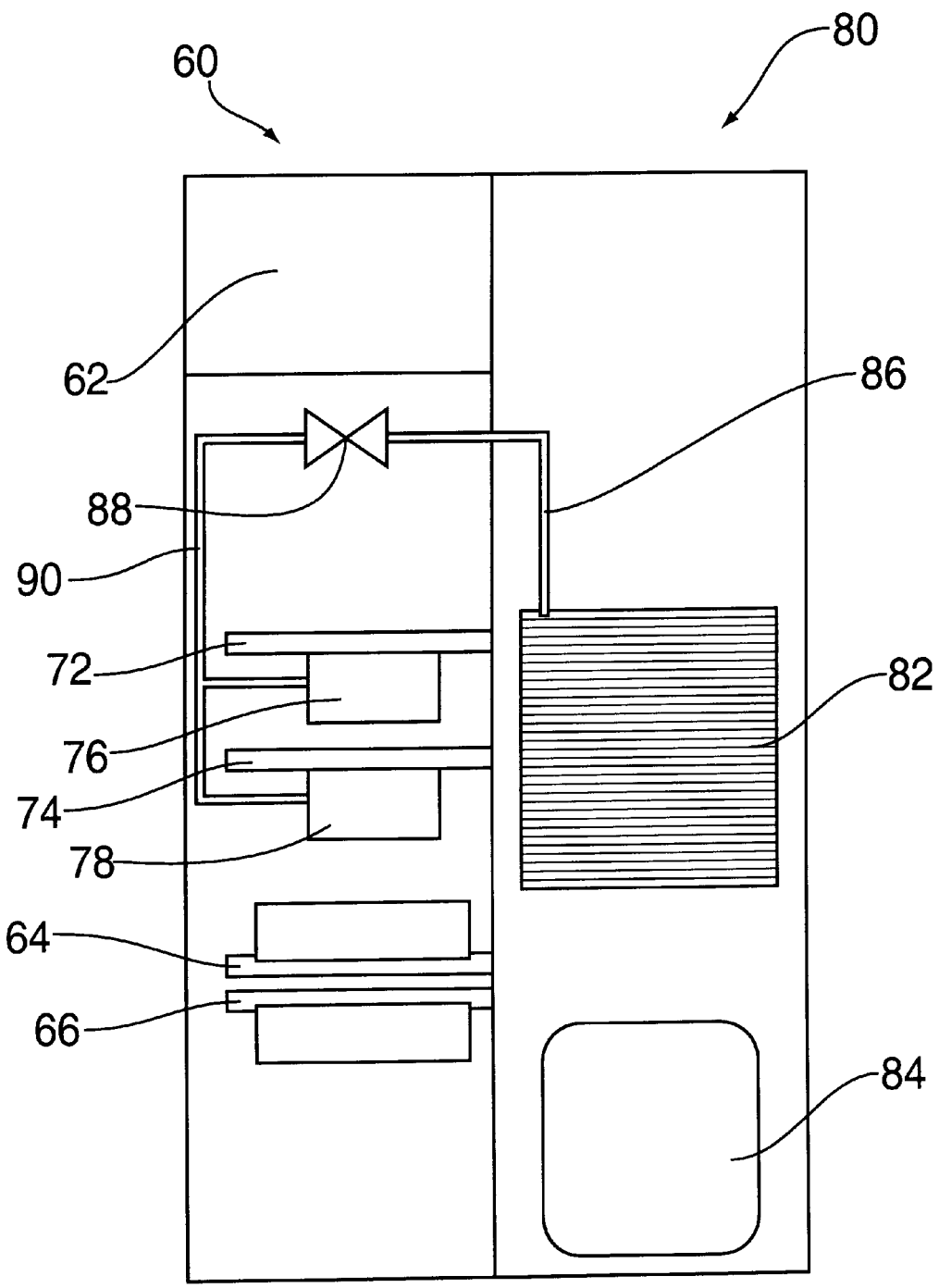
FIG. 4 is a simplified front view depicting the arrangement of components in a typical workstation processor unit with cooled IC modules.

FIG. 4 is a simplified front view showing the arrangement of components in a typical computer workstation processor unit 60 wherein one or more integrated circuit chip modules is cooled through a refrigerated evaporator unit. The processor unit 60 consists of a power supply 62, memory cards 64 and 66, to which component modules 68 and 70 are mounted, and processor PCB cards 72 and 74, to which evaporator cooled processor integrated chip modules enclosed within insulated housings 76 and 78 are mounted. Mated next to the processor unit 60 is sidecar refrigeration unit 80 which provides cooling for processor unit 60. Refrigeration unit 80 consists of condenser 82 and compressor 84, interconnected with appropriate housing and conduits (not shown) and connected through flexible refrigerant line 86 with quick connect coupling 88 to refrigerant distribution hose 90. Distribution hose 90 conducts coolant to the evaporator blocks within insulated housings 76 and 78 to cool the enclosed IC modules.

While the invention has been described with reference to specific embodiments thereof, it is intended that all matter contained in the above description and shown in the accompanying drawings be interpreted as illustrative and not limiting in nature. Various modifications of the disclosed embodiments, as well as other embodiments of the invention, will be apparent to those skilled in the an upon reference to this description, or may be made without departing from the spirit and scope of the invention as defined in the amended claims.

We claim:

1. A cooling assembly for an integrated circuit chip module mounted on a printed circuit board substrate comprising:

an evaporator unit having a thermal interface in thermal communication with said integrated circuit chip module so as to cool said module to a temperature below ambient dew point; and, an insulated housing having its base attached to said printed circuit board substrate and surrounding the outer perimeter of said integrated circuit module so as to enclose said evaporator unit and said integrated circuit module, said housing having a moisture barrier on its outer surface.

2. The cooling assembly of claim 1 wherein said moisture barrier is a coating material selected from the group consisting of metallic or polymeric coating.

3. The cooling assembly of claim 2 wherein the metallic coating is selected from the group consisting of plasma sprayed, or ion vapor deposited aluminum, nickel, copper, zinc, and the like, or electroplated, or electroless plated copper, nickel, zinc, and the like.

4. The cooling assembly of claim 2 wherein the polymeric coating is a material selected from the group consisting of butyl rubber, synthetic poly(isoprene), and the like.

5. The cooling assembly of claim 4 wherein the moisture barrier is a coating of butyl rubber applied by molding to a thickness of about 0.25 mm to 2 mm.

6. The cooling assembly of claim 1 wherein said insulated housing has its base attached to the printed circuit board through a moisture barrier interface.

7. The cooling assembly of claim 6 wherein said moisture barrier interface is a compliant polymeric gasket.

8. The cooling assembly of claim 7 wherein said moisture barrier interface is a compliant butyl rubber gasket.

9. The cooling assembly of claim 8 wherein the butyl rubber gasket includes recesses on its bottom side facing the printed circuit board to receive components mounted on the printed circuit board in the area of the moisture barrier interface.

10. The cooling assembly of claim 8 wherein the butyl rubber gasket includes protuberances on its upper surface mating with the base of the insulated housing to form a positive seal contact with the surface of the housing base.

11. A cooling assembly for an integrated circuit chip module on a printed circuit board substrate comprising:

an evaporator unit having a thermal interface in thermal communication with said integrated circuit chip module so as to cool said module to a temperature below ambient dew point; and an insulated housing having its base attached to said printed circuit board substrate and surrounding the outer perimeter of said integrated circuit module so as to enclose said evaporator unit and said integrated circuit module, said housing having a butyl rubber moisture barrier on its outer surface, and a butyl rubber gasket interface between the base of the insulated housing and the printed circuit board.

* * * * *

UNITED STATES PATENT AND TRADEMARK OFFICE
CERTIFICATE OF CORRECTION

PATENT NO.     : 6,125,036
DATED          : September 26, 2000
INVENTOR(S)    : Sukhvinder Kang et al.

It is certified that error appears in the above-identified patent and that said Letters Patent is hereby corrected as shown below:

Column 1,
Line 20, delete "land" and insert therefor -- and --
Line 26, delete "generation" and insert therefor -- generating --
Line 58, delete "practice" and insert therefor -- practiced --
Line 59, delete "direction" and insert therefor -- directing --
Line 64, after "have" insert -- been --

Column 2,
Line 7, after "the" (first occurrence) delete "electric" and insert therefor -- electronic --
Line 27, after "controlled" delete "front" and insert therefor -- from --

Column 3,
Line 39, after "module" delete "inclosed" and insert therefor -- enclosed --
Line 57, after "grease" insert -- layer --
Line 61, delete "module"
Line 62, after "circuit" insert -- board --

Column 4,
Line 12, after "is" delete "separated" and insert therefor -- separate --
Line 22, after "enclosure" delete "front" and insert therefor -- from --
Line 44, after "52." delete "The" and insert therefor -- These --

Signed and Sealed this

Sixteenth Day of March, 2004

JON W. DUDAS
*Acting Director of the United States Patent and Trademark Office*